United States Patent
Lee et al.

(10) Patent No.: US 10,395,578 B2
(45) Date of Patent: Aug. 27, 2019

(54) FLAT PANEL DISPLAY DEVICE HAVING DISPLAY AREAS WITH THE APPEARANCE OF ROUNDED CORNERS

(71) Applicant: Samsung Display Co., Ltd., Yongin-si (KR)

(72) Inventors: Chang-Soo Lee, Suwon-si (KR); Mugyeom Kim, Hwaseong-si (KR); Sungjae Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 67 days.

(21) Appl. No.: 15/425,398

(22) Filed: Feb. 6, 2017

(65) Prior Publication Data
US 2018/0144675 A1    May 24, 2018

(30) Foreign Application Priority Data
Nov. 22, 2016  (KR) .................. 10-2016-0155993

(51) Int. Cl.
*G09G 3/20* (2006.01)
*F21V 33/00* (2006.01)
(Continued)

(52) U.S. Cl.
CPC ....... *G09G 3/2003* (2013.01); *F21V 33/0052* (2013.01); *G02F 1/133308* (2013.01); *G09G 3/2092* (2013.01); *H01L 27/326* (2013.01); *F21Y 2113/10* (2016.08); *F21Y 2115/10* (2016.08); *G02F 2001/13332* (2013.01); *G09G 2300/0413* (2013.01); *G09G 2300/0426* (2013.01); *G09G 2310/0232* (2013.01); *H01L 27/3211* (2013.01); *H01L 51/524* (2013.01)

(58) Field of Classification Search
CPC ............... G09G 3/2003; G09G 3/2092; G09G 2310/0232; F21V 33/0052; G02F 1/133308; H01L 51/524; H01L 27/3211; H01L 27/326; F21Y 2115/10; F21Y 2113/10
See application file for complete search history.

(56) References Cited

U.S. PATENT DOCUMENTS

| 5,469,189 A | * | 11/1995 | Noguchi | G06F 3/0481 345/441 |
| 6,697,080 B2 | * | 2/2004 | Trika | G06T 11/203 345/441 |

(Continued)

FOREIGN PATENT DOCUMENTS

| KR | 1020080112193 | 12/2008 |
| KR | 1020110067881 | 6/2011 |

(Continued)

*Primary Examiner* — Christopher E Leiby
(74) *Attorney, Agent, or Firm* — H.C. Park & Associates, PLC

(57) ABSTRACT

A display device may include: a display unit including: a display area having a plurality of pixels to display an image; and a non-display area surrounding the display area; and a frame covering at least a portion of the non-display area, the frame having a rounded outer corner and an inner corner, wherein the plurality of pixels includes a first pixel disposed between the inner corner and a curved line or under the curved line, and wherein the display device is configured to operate the first pixel to constantly generate a first color while the image is displayed.

3 Claims, 10 Drawing Sheets

(51) Int. Cl.
  *G02F 1/1333* (2006.01)
  *H01L 27/32* (2006.01)
  *F21Y 113/10* (2016.01)
  *F21Y 115/10* (2016.01)
  *H01L 51/52* (2006.01)

(56) References Cited

U.S. PATENT DOCUMENTS

| | | | | |
|---|---|---|---|---|
| 9,059,119 B2* | 6/2015 | Sung | | H01L 27/3241 |
| 2008/0122859 A1* | 5/2008 | Cazier | | G09G 5/06 |
| | | | | 345/593 |
| 2009/0051830 A1* | 2/2009 | Matsushita | | G02F 1/133305 |
| | | | | 348/836 |
| 2009/0115933 A1* | 5/2009 | Mimura | | G02F 1/133512 |
| | | | | 349/59 |
| 2010/0289994 A1* | 11/2010 | Nonaka | | G02F 1/133514 |
| | | | | 349/108 |
| 2011/0018462 A1* | 1/2011 | Lowe | | F21V 23/04 |
| | | | | 315/294 |
| 2011/0141379 A1* | 6/2011 | Ichioka | | G09G 5/00 |
| | | | | 348/841 |
| 2012/0256890 A1* | 10/2012 | Araki | | G02F 1/133308 |
| | | | | 345/204 |
| 2014/0204127 A1* | 7/2014 | Tann | | H04N 21/440272 |
| | | | | 345/660 |
| 2015/0091825 A1* | 4/2015 | Wu | | G09G 5/00 |
| | | | | 345/173 |
| 2016/0267847 A1* | 9/2016 | Chen | | G09G 3/3283 |
| 2016/0291376 A1* | 10/2016 | Iwatsu | | G02F 1/133512 |
| 2017/0372675 A1* | 12/2017 | Cho | | G09G 5/005 |

FOREIGN PATENT DOCUMENTS

| | | |
|---|---|---|
| KR | 1020140117491 | 10/2014 |
| KR | 1020140120162 | 10/2014 |
| WO | 2014010463 | 6/2016 |

* cited by examiner

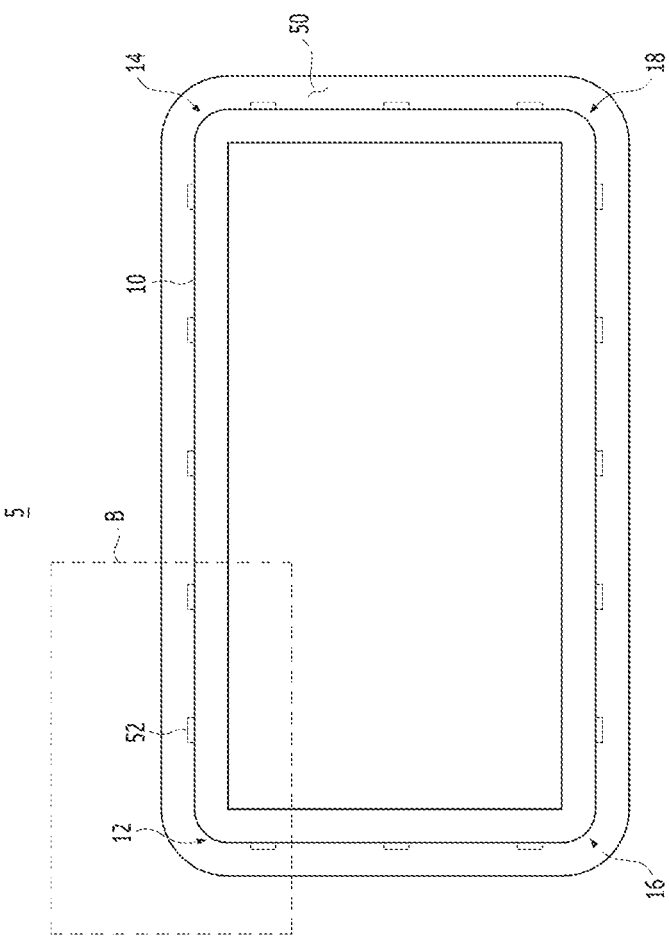

FLAT PANEL DISPLAY DEVICE HAVING DISPLAY AREAS WITH THE APPEARANCE OF ROUNDED CORNERS

CROSS-REFERENCE TO RELATED APPLICATION

This application claims priority from and the benefit of Korean Patent Application No. 10-2016-0155993, filed on Nov. 22, 2016, which is hereby incorporated by reference for all purposes as if fully set forth herein.

BACKGROUND

Field

The invention relates generally to flat panel display devices and, more particularly, to flat panel display devices having display areas with the appearance of rounded corners.

Discussion of the Background

Display devices are one of the most recognized part of electronic devices. Whether in the form of a cellular phone, consumer appliance, portable computer, television, or the like, aesthetic and ergonomic appeal is as much of a design consideration as display quality and overall performance. Moreover, consumer demand has been trending toward display devices having more screen real estate without necessarily increasing the size of the display device. Thus, display devices having rounded corners are gaining attention to meet this consumer demand.

The display panels themselves are complex devices made from thin layers of semiconductor materials having large numbers of nanometer-sized electronic components including pixels, thin-film transistors, capacitors and associated circuitry, which are difficult to manufacture with rounded corners. Accordingly, there is need for an efficient way to create display devices with rounded corners without sacrificing performance or significantly increasing costs.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments constructed according to the principles of the invention meet the foregoing need by providing flat panel display devices having rectangular display areas that give the appearance of having rounded corners.

Additional aspects will be set forth in the detailed description which follows, and, in part, will be apparent from the disclosure, or may be learned by practice of the inventive concept.

According to one aspect of the invention, a display device may include: a display unit including: a display area having a plurality of pixels to display an image; and a non-display area surrounding the display area; and a frame covering at least a portion of the non-display area, the frame having a rounded outer corner and an inner corner, wherein the plurality of pixels includes a first pixel disposed between the inner corner and a curved line or under the curved line, and wherein the display device is configured to operate the first pixel to constantly generate a first color while the image is displayed.

The plurality of pixels may further include a second pixel having equal to or more than 50% of its surface area disposed between the curved line and the inner corner or under the curved line, and wherein the display device is configured to operate the second pixel to constantly generate the first color while the image is displayed.

The plurality of pixels may further include a third pixel having less than 50% of its surface area disposed between the curved line and the inner corner or under the curved line, and wherein the display device is configured to operate the third pixel to constantly generate the first color while the image is displayed.

The first color may be substantially similar to the color of the frame.

The curved line may be an imaginary curved line disposed in the display area adjacent to an inner boundary of the frame.

The display device may be configured to receive a user signal from a user, and adjust a curvature of the curved line in response to the received user signal.

The display device may further include: a plurality of ambient lights supported by the frame to generate a light having a color substantially similar to the first color.

The display device may further include: a diffusion glass disposed surrounding the outer edges of the frame, the diffusion glass including at least one irregular surface configured to diffuse the light generated by the plurality of ambient lights.

The display device may be configured to receive a signal from a user to change the color of the light generated by the plurality of ambient lights.

The curved line may be defined by the inner boundary of the frame.

The corners of the display unit may be inscribed substantially within the frame.

The non-display area at the corners of the display unit may be trimmed.

The curved line may have a radius in the range of substantially equal to or greater than 25 mm and substantially equal to or less than 60 mm.

According to one aspect of the invention, a display device may include: a display unit configured to display an image in a display area surrounded by a non-display area, the display unit including: a display panel having a first set of pixels and a second set of pixels disposed in the display area; a signal controller configured to receive an input image signal, generate an image data signal in response to the received input image signal, and control the first set of pixels to display the image and the second set of pixels to constantly display a first color to create the appearance of rounded corners in the display area.

The display device may further include a frame covering at least a portion of the non-display area, the frame having a rounded outer corner and an inner corner.

The signal controller may include: a memory including a preset database of second set of pixels corresponding with levels of curvature displayed at the corner of the display panel.

A processor of the signal controller may be configured to extract the second set of pixels corresponding to a level of curvature displayed at the corner of the display panel.

The display may be configured to receive a user signal from a user, the user signal including a corner signal indicating a level of curvature.

The first color may be identical with a color of the frame.

The display device may further include: a plurality of ambient lights supported by the frame to generate a light having a color substantially similar to the first color.

The display panel may include a liquid crystal display (LCD) panel or light emitting diode (LED) display panel.

According to one aspect of the invention, a method of operating a display device to display a rounded corner having a curvature in a corner of a generally rectangular display area supported by a frame of the display device, the method including: generating a first image signal to operate a first set of pixels in or adjacent to the corners of the display area to constantly generate a first color substantially similar to the color of the frame or lights supported by the frame; and generating a second image signal to operate a second set of pixels to display the image.

According to one aspect of the invention, a method of operating a flat panel display may include the steps of: displaying an image in a display area; and controlling a light source to create the appearance of rounded corners at the regions between the display area and the non-display area, wherein the flat panel display may include: a substantially rectangular display area; a non-display area supported by a frame member having an inner and outer boundary, the frame member covering a portion of the non-display area and exposing at least a part of the display area; and a light source adjacent to the frame member.

The step of controlling the light source may include generating a light having a first color substantially similar to the frame.

The light source may include a first set of pixels disposed in or adjacent to the corners of the display area adjacent to the inner boundary of the frame member, and wherein the step of controlling the light source may further include operating the first set of pixels to generate the first color.

The light source may further include a plurality of lights supported by the frame, and wherein the step of controlling the light source may further include operating the plurality of lights to generate a first color.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 5 is a plan view illustrating a display device according to another exemplary embodiment of the invention.

DETAILED DESCRIPTION OF THE ILLUSTRATED EMBODIMENTS

Figure 1:
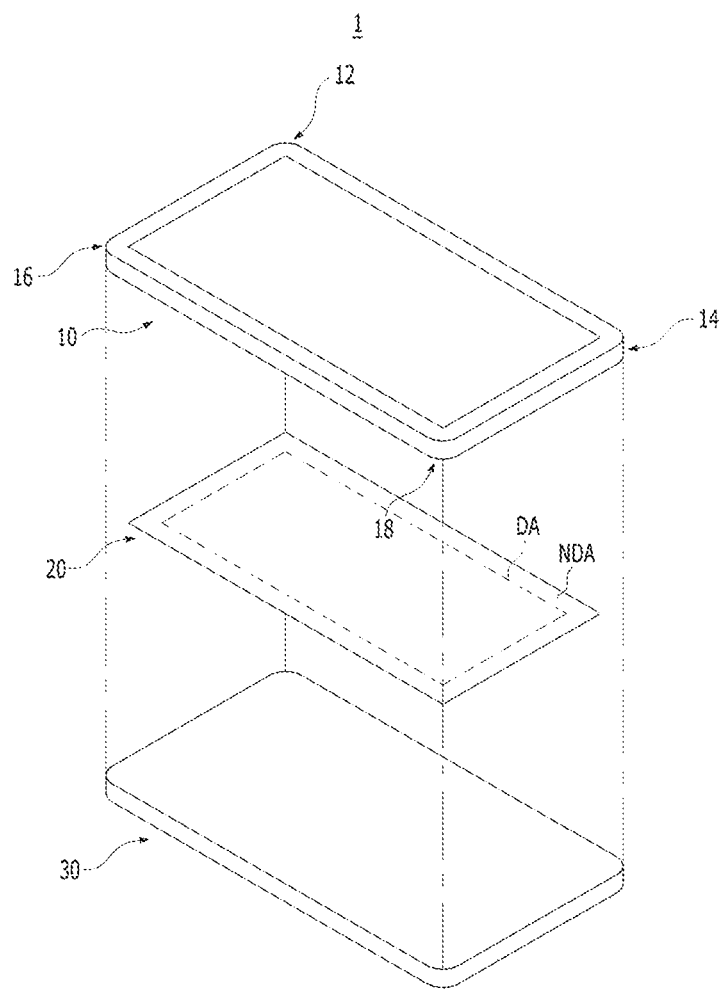
FIG. 1 is an exploded perspective view illustrating a display device constructed according to an exemplary embodiment of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to plan and/or sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. Accordingly, the regions illustrated in the drawings are schematic in nature and their shapes are not intended to illustrate the actual shape of a region of a device and are not intended to be limiting Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is an exploded perspective view illustrating a display device 1 constructed according to an exemplary embodiment of the invention.

Referring to FIG. 1, the display device 1 may include a bezel 10, a display unit 20, and a back cover 30. The display unit 20 may be disposed between the bezel 10 and the back cover 30, and the bezel 10 and the back cover 30 may enclose the display unit 20 and provide protection to the display unit 20.

FIG. 1 illustrates that the display device 1 has a substantially rectangular shape in a planar view, but the exemplary embodiments are not necessarily limited thereto. The display unit may have a shape of any polygon, for example, but not limited to, a triangle, a pentagon, and a hexagon. For descriptive purpose, a display unit having a rectangular shape will be described hereinafter, but the same inventive concept may be applied to any display unit having any polygon shape.

According to an exemplary embodiment, the bezel 10 may also have a substantially rectangular shape in a planar view according to the display device 1. The bezel 10 may include first, second, third, and fourth outer corners 12, 14, 16, and 18. At least one of the first, second, third, and fourth outer corners 12, 14, 16, and 18 may be a rounded outer corner. The first rounded outer corner 12 may have a first curvature. The bezel 10 may have rounded outer corners at all of the first, second, third, and fourth outer corners 12, 14, 16, and 18 of the rectangular shape, and the first, second, third, and fourth rounded outer corners 12, 14, 16, and 18 may all have the same first curvature. However, the exemplary embodiments are not limited thereto, and the first, second, third, and fourth rounded outer corners 12, 14, 16, and 18 may have different curvatures. For example, the first, second, third, and fourth rounded outer corners 12, 14, 16, and 18 may all have different curvatures. For example, the first and second rounded outer corners 12 and 14 may have the first curvature, and the third and fourth rounded outer corners 16 and 18 may have the second curvature.

The bezel 10 may include a window structure 40. The window structure 40 may include any transparent material including glass, plastic, etc.

The back cover 30 may have a shape substantially the same as the shape of the bezel 10. For example, when the bezel 10 includes four rounded outer corners 12, 14, 16, and 18 having the same first curvature, the four corners of the back cover 30 may have the same first curvature. When the bezel 10 includes the first, second, third, and fourth rounded outer corners 12, 14, 16, and 18 having different curvatures, the four corners of the back cover 30 may have different curvatures corresponding to the curvatures of the first, second, third, and fourth rounded outer corners 12, 14, 16, and 18. When the bezel 10 includes the first and second rounded outer corners 12 and 14 having the first curvature and the third and fourth rounded outer corners 16 and 18 having the second curvature, the two corners of the back cover 30 corresponding to the first and second rounded outer corners 12 and 14 may have the first curvature and the two corners of the back cover 30 corresponding to the third and fourth rounded outer corners 16 and 18 may be the second curvature.

The bezel 10 and the back cover 30 may include a solid material such as metal, synthetic resin, etc., to protect the display unit 20 from an external impact or force.

The display unit 20 may display an image through the window structure 40 of the bezel 10. The display unit 20 may include various types of display device including a liquid crystal display LCD and an organic light emitting diode OLED display.

According to an exemplary embodiment, the display unit 20 may include an LCD (not illustrated). The LCD may include a liquid crystal panel configured to display an image using a light supplied from a backlight assembly. The liquid crystal panel may include a liquid crystal layer interposed between a first substrate and a second substrate. The first substrate and the second substrate may include a thin film transistor (TFT) and apply an electric field to the liquid crystal layer to control the light transmittance. The display unit 20 including the liquid crystal panel may include a backlight assembly disposed under the liquid crystal panel to supply the light to the liquid crystal panel. The backlight assembly may include a light source member, a reflecting member, and an optical sheet.

The light source member is configured to generate the light. The light source member may include a plurality of light sources. For example, the plurality of light sources may be disposed on a light source substrate, or the plurality of light sources may be disposed at the outer edges of the light source member. For example, the light sources may include light emitting diodes (LEDs), cold cathode fluorescent lamps (CCFLs), etc. when the light sources include the light emitting diodes (LEDs), the light emitting diodes (LEDs) may be individually operated based on an image signal that is applied to the liquid crystal layer.

The reflecting member may be further disposed under the light sources. The reflecting member may guide the light generated from the light source toward the liquid crystal panel, thereby increasing luminance of the display device.

The optical sheet may be disposed between the light sources and the liquid crystal panel to increase the uniformity of luminance of the light generated from the light source member. For example, the optical sheet may be a prism sheet, a diffusion sheet, etc. The optical sheet may be combined with another optical sheet to form an optical film assembly.

According to an exemplary embodiment, the display unit 20 may include an OLED display (not illustrated). The OLED display may include a plurality of light emission units configured to display an image by generating corresponding light. Each of the plurality of light emission units may include a thin film transistor TFT and an organic light-emitting diode OLED. The OLED may include a first electrode and a second electrode, and an intermediate layer interposed between the first and second electrodes. The first and second electrodes may respectively be anode and a cathode, and vice versa.

The intermediate layer may include an organic emission layer. The intermediate layer includes an organic emission layer and may further include at least one of a hole injection layer, a hole transport layer, an electron transport layer, and an electron injection layer, which are common layers. The intermediate layer may further include various functional layers to assist emission of the light generated in the organic emission layer, in addition to the aforementioned common layers. The functional layers may have improved performance of the organic emission layer, improved brightness and the like, or improved viewing angle.

Figure 2:
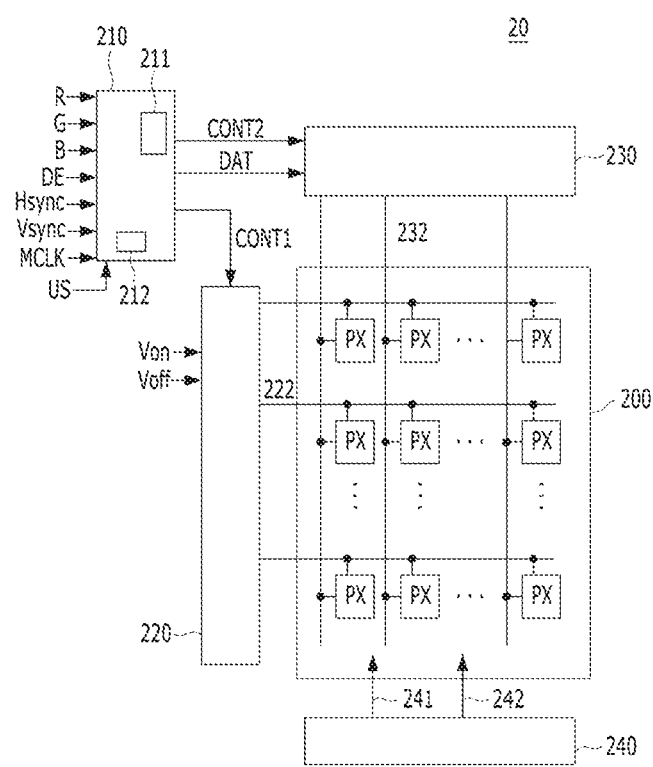
FIG. 2 is a diagram illustrating a display unit and associated circuitry of the display device according to an exemplary embodiment of the invention.

FIG. 2. is a diagram illustrating the display unit 20 and associated circuitry of the display device 1 according to an exemplary embodiment of the invention. Referring to FIG. 2, the display unit 20 may include a display panel 200, a signal controller 210, a gate driver 220, and a data driver 230.

The signal controller 210 may receive an input image signal RGB (e.g., video signals) provided by an external device and an input control signal for controlling the input image signal RGB. The input image signal RGB may include luminance information for each pixels PX and the luminance information may have a predetermined number (e.g., 1024=210, 256=28, or 64=26) of grayscale values. The input control signal may include a vertical synchronization signal Vsync, a horizontal synchronization signal Hsync, a main clock signal MCLK, a data enable signal DE, and a user signal US.

The signal controller 210 may include a processor 211 and a memory 212. The signal controller 210 may generate a scan control signal CONT1, a data control signal CONT2, and an image data signal DAT based on the input image signal RGB and the input control signal. The signal controller 210 may send the scan control signal CONT1 to the gate driver 220 based on the input image signal RGB and at least one of the image control signal and the pixel location information. The signal controller 210 may send the data control signal CONT2 and the image data signal DAT to the data driver 230.

The gate driver 220 may control the application of a scan signal, a combination of a gate-on voltage Von and a gate-off voltage Voff to the plurality of scan lines 222 according to the scan control signal CONT1. The gate driver 220 may be connected to the plurality of scan lines 222 and may apply the scan signal, the combination of a gate-on voltage Von and the gate-off voltage Voff to the plurality of scan lines 222 according to the scan control signal CONT1. The gate driver 220 may sequentially apply a scan signal with the gate on voltage Von to the plurality of scan lines 222.

The data driver 230 may control the application of a data voltage to the plurality of data lines 232 in the display panel 200 according to the data control signal CONT2 and the image data signal DAT. Thus, the data driver 230 may be connected to the plurality of data lines 232 and may apply the data voltage to the display panel 200 according to the data control signal CONT2. The data driver 230 may select the data voltage according to the grayscale value of the image data signal DAT. When the gate driver 220 sequentially applies the scan signal with the gate on voltage Von to the plurality of scan lines 222, the data driver 230 may apply the data voltage for the plurality of pixels PX on the horizontal line that corresponds to the scan line to which the gate on voltage Von is applied to the plurality of data lines 232.

The power supply 240 may supply a first power source voltage 241 and a second power source voltage 242 to the display panel 200. The first power source voltage 241 may be positive voltage and the second power source voltage 242 may be negative voltage or vice versa.

In exemplary embodiments, the signal controller 210, the gate driver 220, the data driver 230, the power supply 240, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the signal controller 210, the gate driver 220, the data driver 230, the power supply 240, and/or one or more components thereof may include or otherwise be associated with one or more memories (not shown) including code (e.g., instructions) configured to cause the signal controller 210, the gate driver 220, the data driver 230, the power supply 240, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CDRW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

The display unit 20 may have a display area DA and a non-display area NDA. The display area DA of the display unit 20 may refer to a part of the display unit 20 which is configured to display an image. The non-display area NDA of the display unit 20 may refer to a part of the display unit 20 which does not display an image.

According to an exemplary embodiment, the display area DA may have a substantially rectangular shape. However, the exemplary embodiments are not limited thereto, and the display area DA may have a shape of any polygon, for example, but not limited to, a triangle, a pentagon, and a hexagon, according to the shape of the display device 1. For descriptive purpose, the display area DA having a rectangular shape, according to the rectangular shape of the display device 1, will be described hereinafter, but the same inventive concept may be applied to any display unit having any polygon shape.

The display area DA of the display unit 20 may include a plurality of pixels PX. The plurality of pixels PX may be disposed in a matrix format. Each of the plurality of pixels may include a set of subpixels (not illustrated). The set of subpixels may include a first subpixel, a second subpixel, and a third subpixel. The first subpixel may be configured to display a first color, the second subpixel may be configured to display a second color, and the third subpixel may be configured to display a third color. For example, the first subpixel may be configured to display a red color, the second subpixel may be configured to display a green color, and the third subpixel may be configured to display a blue color. The set of subpixels may further include a fourth subpixel configure to display a fourth color. For example, the fourth subpixel may be configured to display a white color.

According to an exemplary embodiment, the signal controller 210, the gate driver 220, and the data driver 230 may be disposed in the non-display area NDA of the display unit 20. However, the exemplary embodiments are not limited thereto, and the signal controller 210, the gate driver 220, and the data driver 230 may be disposed on the back side of the display unit 20 in the display area DA.

Figure 3:
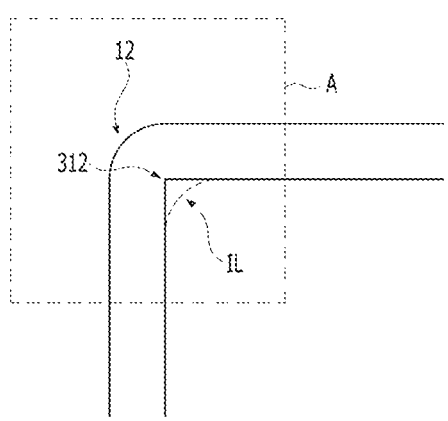
FIG. 3 illustrates an exemplary embodiment of a first outer corner and a first inner corner of the bezel of display unit illustrated in FIG. 1.

FIG. 3 illustrates an exemplary embodiment of the first outer corner 12 and a first inner corner 312 of the bezel 10 of the bezel of the display device 1 illustrated in FIG. 1. The inner corner 312 is formed at the boundary of the bezel 10 and the window structure 40.

According to the exemplary embodiment, the inner corner 312 of the bezel 10 may be substantially angled. In other words, compared to the outer corner 12 of the bezel 10 which is a rounded corner, the inner corner 312 of the bezel 10 may be substantially angled. For example, the inner corner 312 of the bezel 10 may form a substantially right angle. However, the exemplary embodiments are not limited thereto, and the inner corner 312 of the bezel 10 may form an angle corresponding to the shape of the bezel 10.

The display area DA is exposed through the window structure 40. The display area DA of the display unit 20 may display an image through the window structure 40. The bezel 10 may be disposed covering the non-display area NDA of the display unit 20.

Referring to FIG. 3, an imaginary line IL is shown in the display area DA at a vicinity of the first inner corner 312 of the bezel 10. The imaginary line IL may be a guideline provided for representing a rounded corner in the display area DA. The imaginary line IL is merely shown for explanation purpose only, and not actually expressed on the display area DA, although during operations the pixels in the region of the imaginary line may be illuminated to give the appearance of a rounded corner, as explained herein. Accordingly, the imaginary line IL is illustrated in FIG. 3 as a dotted line.

The imaginary line IL may have a curvature. For example, the imaginary line IL may have a curvature substantially the same as the first curvature of the first outer corner 12 of the bezel 10. However, the exemplary embodiments are not limited thereto, and the imaginary line IL may have a curvature substantially different from the first curvature of the first outer corner 12 of the bezel 10. For example, the curvature of the imaginary line IL may have a radius in a range substantially equal to or greater than 25 mm and substantially equal to or less than 60 mm. More particularly, the radius of the imaginary line IL may be substantially equal to or greater than 35 mm and substantially equal to or less than 50 mm.

Figure 4A:
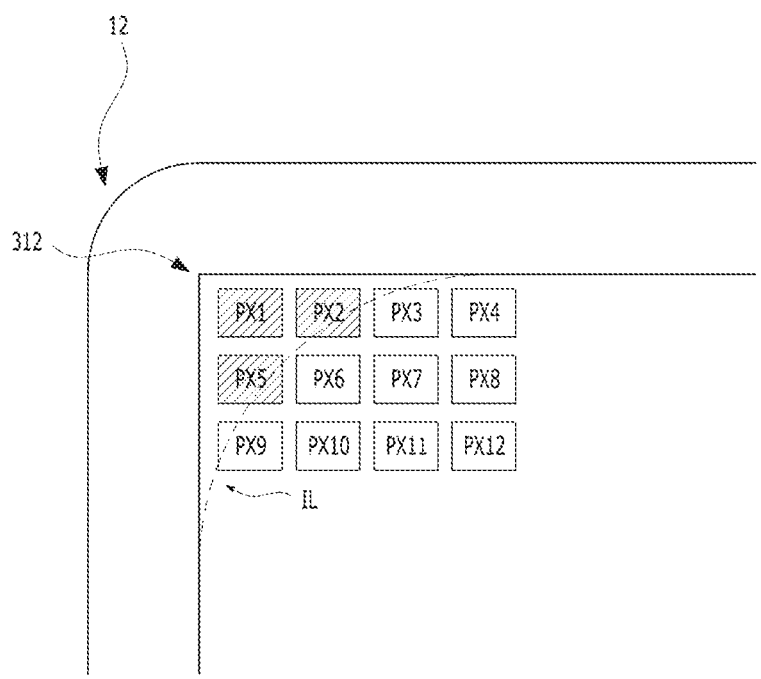
FIG. 4A and FIG. 4B is an enlarged view of the area A of FIG. 3, illustrating exemplary embodiments of the first outer corner and the first inner corner of the bezel of the display unit shown in FIG. 1.
Figure 4B:
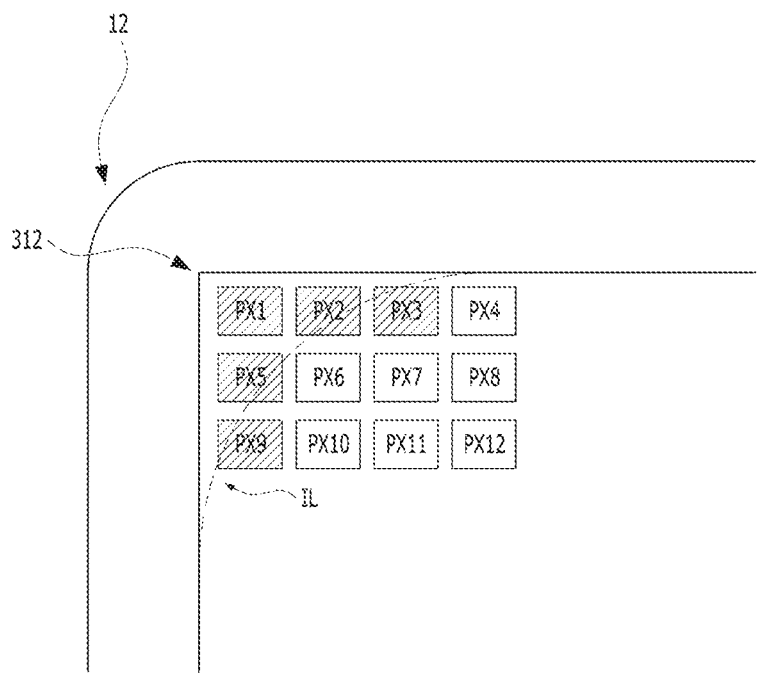

FIGS. 4A and 4B is an enlarged view of the area A of FIG. 3 illustrating exemplary embodiments of the first outer corner 12 and the first inner corner 312 of the bezel 10 of the display device 1 shown in FIG. 1. Referring back to FIG. 3, an operation of the display unit 20 of the display device 1 in the display area DA to provide a rounded corner in the display area DA will be described with reference to FIGS. 4A and 4B Referring to FIG. 4A, the plurality of pixels may include a first pixel PX1, a second pixel PX2, a third pixel PX3, a fourth pixel PX4, a fifth pixel PX5, a sixth pixel PX6, a seventh pixel PX7, an eighth pixel PX8, a ninth pixel PX9, a tenth pixel PX10, an eleventh pixel PX11, and a twelfth pixel PX12 disposed in the display area DA at the vicinity of the first inner corner 312 of the bezel 10. According to FIG. 4A, the first pixel PX1 is disposed between the first inner corner 312 and the imaginary line IL, the second pixel PX2, the third pixel PX3, the fifth pixel PX5, and the ninth pixel PX9 overlap the imaginary line IL, and the fourth pixel PX4, the sixth pixel PX6, the seventh pixel PX7, the eighth pixel PX8, the tenth pixel, PX10, the eleventh pixel PX11, and the twelfth pixel PX12 are disposed within the imaginary line IL.

The second pixel PX2, the third pixel PX3, the fifth pixel PX5, and the ninth pixel PX9 overlap the imaginary line IL. More specifically, parts of the second pixel PX2 and the fifth pixel and PX5 disposed between the first inner corner 312 and the imaginary IL are equal to or more than 50% of the respective surface area of the second pixel PX2 and the fifth pixel PX5. Parts of the third pixel PX3 and the ninth pixel PX9 disposed between the first inner corner 312 and the imaginary line IL are less than 50% of the respective surface area of the third pixel PX3 and the ninth pixel PX9.

According to the exemplary embodiment illustrated in FIG. 4A, the display unit 20 of the display device 1 may operate the pixels to display the rounded corner in the display area DA in response to the imaginary line IL. More specifically, the pixels disposed within the imaginary line IL and the pixels with less than 50% of their respective surface areas disposed between the first inner corner 312 and the imaginary line IL are operated in a normal mode. The normal mode may refer to operating respective pixels to generate color to display an image. On the other hand, the pixels disposed between the first inner corner 312 and the imaginary line IL and the pixels with equal to or more than 50% of their respective surface areas disposed between the first inner corner 312 and the imaginary line IL are operated in a corner mode. The corner mode may refer to operating respective pixels to generate certain color to display the rounded corner in the display area.

Referring to FIG. 4A, the first pixel PX1 is disposed between the first inner corner 312 and the imaginary line IL, and the second pixel PX2 and the fifth pixel PX5 have equal to or more than 50% of their respective surface areas disposed between the first inner corner 312 and the imaginary line IL. Accordingly, the first pixel PX1, the second pixel PX2, and the fifth pixel PX5 are operated in the corner mode.

The fourth pixel PX4, the sixth pixel PX6, the seventh pixel PX7, the eighth pixel PX8, the tenth pixel PX10, the eleventh pixel PX11, and the twelfth pixel PX12 are disposed within the imaginary line IL, and the third pixel PX3 and the ninth pixel PX9 have less than 50% of their respective surface areas disposed between the first inner corner 312 and the imaginary line IL. Accordingly, the third pixel PX3, The fourth pixel PX4, the sixth pixel PX6, the seventh pixel PX7, the eighth pixel PX8, the ninth pixel PX9, the tenth pixel PX10, the eleventh pixel PX11, and the twelfth pixel PX12 are operated in the normal mode.

When a pixel is operated in the corner mode, the pixel is operated to generate a certain color. For example, the pixel operated in the corner mode may be operated to generate a black color. For example, the pixel operated in the corner mode may be operated to generate a first color which is substantially identical to the color of the bezel 10. According to the exemplary embodiments, the pixels disposed adjacent to the first inner corner 312 may be configured to operate in the corner mode and the pixels disposed adjacent to the first inner corner 312 may be configured to generate a first color which is substantially identical to the color of the bezel 10. Accordingly, the pixels disposed adjacent to the first inner corner 312 may display a rounded corner in the display area DA integral with the bezel 10 including the first inner corner 312 which is substantially angled.

Referring back to FIG. 2, the signal controller 210 receives the input control signal including the user signal US. The signal controller 210 may generate the image data signal DAT based on the input image signal RGB and the input control signal. Accordingly, the signal controller 210 may generate the image data signal DAT so that the data driver 230 may apply a corner data voltage corresponding to the corner mode to the pixels operating in the corner mode. Referring to FIG. 4A, the signal controller 210 may generate the image data signal DAT so that the data driver 230 may apply the corner data voltage corresponding to the corner mode to the first pixel PX1, the second pixel PX2, and the fifth pixel PX5, and in turn, the first pixel PX1, the second pixel PX2, and the fifth pixel PX5 may be operated in the corner mode.

FIG. 4B illustrates an exemplary embodiment which is substantially the same as the exemplary embodiment of FIG. 4A, except for the operation of the pixels that overlap the imaginary line IL. According to FIG. 4B, the second pixel PX2, the third pixel PX3, the fifth pixel PX5, and the ninth pixel PX9 overlap the imaginary line IL.

According to the exemplary embodiment illustrated in FIG. 4B, the display unit 20 of the display device 1 may operate the pixels to display the rounded corner in the display area DA in response to the imaginary line IL. More specifically, the pixels disposed within the imaginary line IL are operated in the normal mode. Compared to the exemplary embodiment illustrated in FIG. 4A, the pixels disposed between the first inner corner 312 and the imaginary line IL and the pixels overlapping the imaginary line IL are operated in the corner mode.

Referring to FIG. 4B, the first pixel PX1 is disposed between the first inner corner 312 and the imaginary line IL, and the second pixel PX2 the third pixel PX3, the fifth pixel PX5, and the ninth pixel PX9 are disposed overlapping the imaginary line IL. Accordingly, the first pixel PX1, the second pixel PX2 the third pixel PX3, the fifth pixel PX5, and the ninth pixel PX9 are operated in the corner mode.

The fourth pixel PX4, the sixth pixel PX6, the seventh pixel PX7, the eighth pixel PX8, the tenth pixel PX10, the eleventh pixel PX11, and the twelfth pixel PX12 are disposed within the imaginary line IL. Accordingly, the fourth pixel PX4, the sixth pixel PX6, the seventh pixel PX7, the eighth pixel PX8, the tenth pixel PX10, the eleventh pixel PX11, and the twelfth pixel PX12 are operated in the normal mode.

Referring back to FIG. 2, the signal controller 210 receives the input control signal including the user signal US. The signal controller 210 may generate the image data signal DAT based on the input image signal RGB and the input control signal. Accordingly, the signal controller 210 may generate the image data signal DAT so that the data driver 230 may apply the corner data voltage corresponding to the corner mode to the pixels operating in the corner mode. Referring to FIG. 4B, the signal controller 210 may generate the image data signal DAT so that the data driver 230 may apply the corner data voltage corresponding to the corner mode to the first pixel PX1, the second pixel PX2 the third pixel PX3, the fifth pixel PX5, and the ninth pixel PX9, and in turn, the first pixel PX1, the second pixel PX2 the third pixel PX3, the fifth pixel PX5, and the ninth pixel PX9 may be operated in the corner mode.

FIGS. 4A and 4B illustrate the corner of the display device 1 including the first outer rounded corner 12 for descriptive purpose, and the exemplary embodiments are not necessarily limited thereto. Accordingly, the same inventive concept may be applied to all four corners of the display device 1 respectively including the first, second, third, and fourth outer corners 12, 14, 16, and 18.

FIGS. 4A and 4B illustrates that the imaginary line IL may has the curvature substantially the same as the first curvature of the first outer corner 12 of the bezel 10. However, the exemplary embodiments are not limited thereto, and the imaginary line IL may have a curvature substantially different from the first curvature of the first outer corner 12 of the bezel 10. More specifically, four imaginary lines IL respectively corresponding to the first, second, third, and fourth outer corners 12, 14, 16, and 18 may each have different curvatures.

Referring back to FIG. 2, the signal controller 210 of the display device may receive the user signal US from a user to decide the curvature of the imaginary line IL. According to an exemplary embodiment, the user signal US may represent the actual curvature of the imaginary line IL. For example, the user may input a radius of the curvature of the imaginary line IL in a preset unit, such as inch or centimeter. According to an exemplary embodiment, the user signal US may also represent preset levels of the curvature of the imaginary line IL. For example, the display device 1 may have 5 preset levels of the curvature of the imaginary line IL, each represented by numbers 0, 1, 2, 3, 4, and 5, where the number 0 represents no imaginary line IL, and greater natural number may represent greater curvature of the imaginary line IL. The curvature of the imaginary line IL may be increased by reducing the radius of the imaginary line IL.

According to an exemplary embodiment, the processor 211 of the signal controller 210 may receive the user signal US and decide which pixels are operated in the corner mode in response to the imaginary line IL corresponding to the received user signal US, and generate the image signal DAT in response to the pixels decided to be operated in the corner mode in response to the imaginary line IL. The processor 211 of the signal controller 210 may store the pixels decided to be operated in the corner mode in response to the imaginary line IL corresponding to the received user signal US in the memory 212 of the signal controller 210. According to an exemplary embodiment, the memory 212 may also include a preset database including sets of pixels operated in the corner mode corresponding with each levels of curvature. Accordingly, the processor 211, upon receiving the corner signal including a level of curvature, may extract the set of pixels operated in the corner mode corresponding with the received level of curvature, and generate the image signal DAT according to the extracted set of pixels operated in the corner mode.

FIG. 5 illustrates a display device 5 according to an exemplary embodiment. The display device 5 includes a diffusion glass 50 and a plurality of ambient lights 52. Other parts of the display device 5 are substantially the same with the display device 1 as illustrated in FIG. 1.

The plurality of ambient lights 52 may be disposed in the outer edges of the bezel 10. For example, the plurality of ambient lights 52 may include light emitting diodes (LEDs), cold cathode fluorescent lamps (CCFLs), etc., and be mounted in recesses in the bezel. Furthermore, the plurality of ambient lights 52 may generate a light having a ambient color.

The diffusion glass 50 may be disposed outside the bezel 10, surrounding the outer edges of the bezel 10. The diffusion glass 50 may include any transparent material including glass, plastic, etc., and at least a part of a surface of the diffusion glass 50 may have an irregular surface. The diffusion glass 50 may receive the light generated by the plurality of ambient lights 52, and the received light may be diffused by the irregular surface of the diffusion glass 50. Accordingly, the irregular surface the diffusion glass 50 may diffuse the light generated by the plurality of ambient lights 52.

Referring back to FIG. 2, the user signal US may further include an ambient color information. Accordingly, the signal controller 210 may receive the user signal US including the ambient color information, and control the plurality of ambient lights 52 to generated the light having the ambient color corresponding to the received ambient color information. The signal controller 210 may select one ambient color from a present ambient color set. For example the memory 212 of the signal controller 210 may include the preset ambient color set, and the processor 211 may extract one ambient color from the present ambient color set stored in the memory 212 of the signal controller 210 to control the plurality of ambient lights 52 to generated light having the corresponding ambient color. The ambient color information may also include specific color information input by the user. For example, the user may input a specific RGB code to select corresponding color to be generated by the plurality of ambient lights 52.

Figure 6:
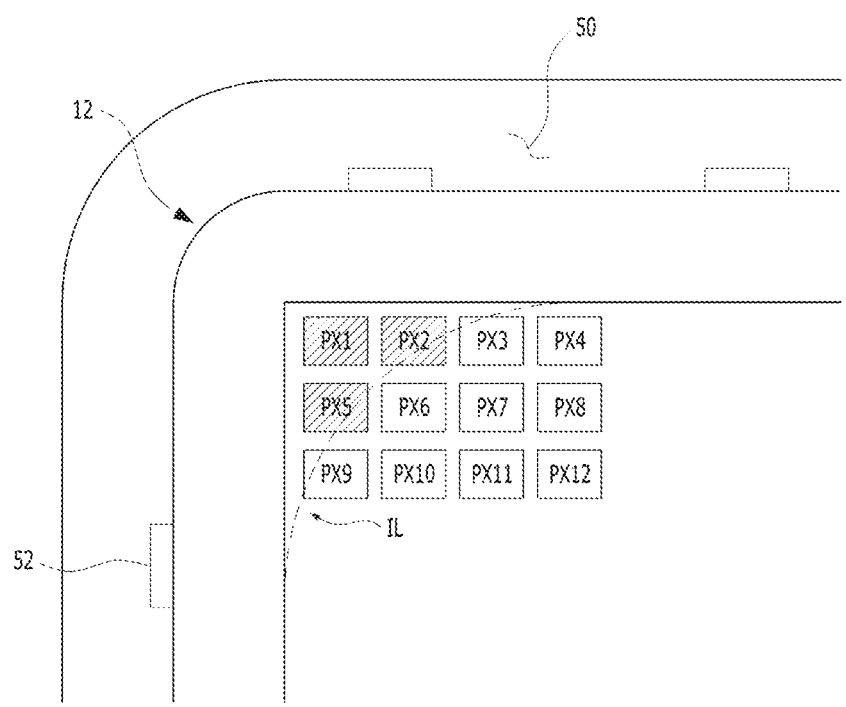
FIG. 6 is an enlarged plan view of the area B of FIG. 5 illustrating another exemplary embodiment of the corner region of the display device.

FIG. 5 is a plan view illustrating a display device according to another exemplary embodiment of the invention. FIG. 6 is an enlarged plan view of the area B of FIG. 5 illustrating another exemplary embodiment of the corner region of the display device.

Referring to FIG. 6, the display area DA of the display device 5 is substantially the same as the display area DA of the display device 1 as illustrated in FIG. 4B. Accordingly, the first pixel PX1, the second pixel PX2 the third pixel PX3, the fifth pixel PX5, and the ninth pixel PX9 are operated in the corner mode, and the fourth pixel PX4, the sixth pixel PX6, the seventh pixel PX7, the eighth pixel PX8, the tenth pixel PX10, the eleventh pixel PX11, and the twelfth pixel PX12 are operated in the normal mode.

Referring to the exemplary embodiment, the pixels operating in the corner mode may be configured to display a color substantially same as the ambient color of the light generated by the plurality of ambient lights 52. Accordingly, the first pixel PX1, the second pixel PX2 the third pixel PX3, the fifth pixel PX5, and the ninth pixel PX9 may be configured to display a color substantially same as the ambient color of the light generated by the plurality of ambient lights 52, and the fourth pixel PX4, the sixth pixel PX6, the seventh pixel PX7, the eighth pixel PX8, the tenth pixel PX10, the eleventh pixel PX11, and the twelfth pixel PX12 may be configured to display a image corresponding to the input image signal RGB.

FIG. 6 illustrates that the display area DA of the display device 5 is substantially the same as the display area DA of the display device 1 as illustrated in FIG. 4B. However, the exemplary embodiments are not necessarily limited thereto, and the display area DA of the display device 5 may be operated in the substantially same way as the display area DA of the display device 1 as illustrated in FIG. 4A. Accordingly, the first pixel PX1, the second pixel PX2, and the fifth pixel PX5 are operated in the corner mode, and the first pixel PX1, the second pixel PX2, and the fifth pixel PX5 are operated in the corner mode may be configured to display a color substantially same as the ambient color of the light generated by the plurality of ambient lights 52.

Figure 7:
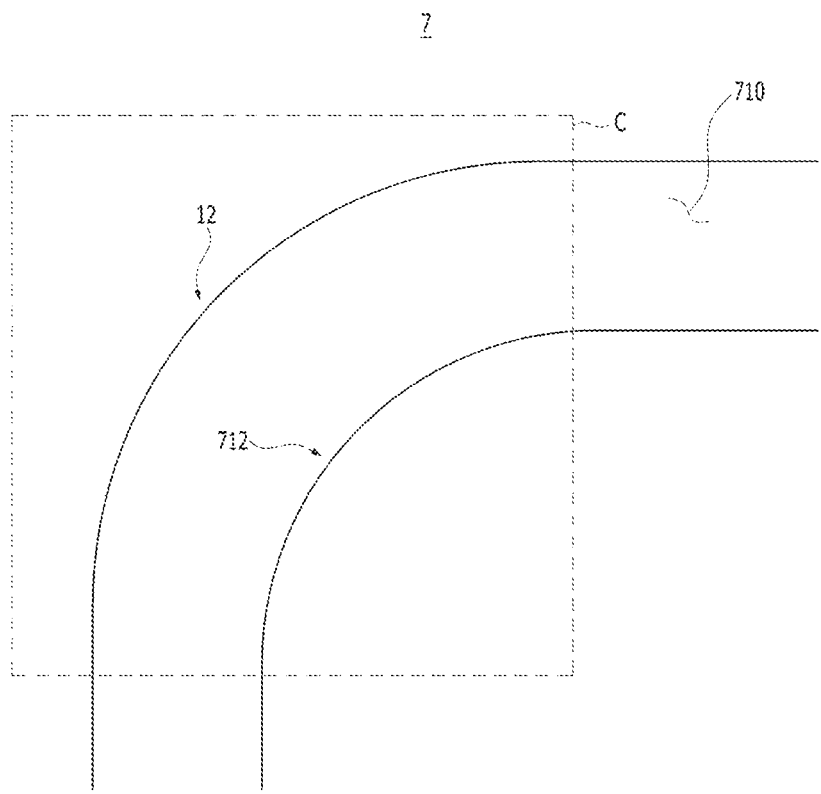
FIG. 7 is an enlarged plan view illustrating another exemplary embodiment of a first outer corner and a first inner corner of the bezel of display unit shown in FIG. 1.

FIG. 7 is an enlarged plan view illustrating another exemplary embodiment of the first outer corner 12 and a rounded first inner corner 712 of the bezel 10 of display device 7. The display device 7 is substantially the same as the display device 1 as illustrated in FIG. 1 except for the bezel 710. The bezel 710 includes the first outer corner 12 and the rounded first inner corner 712. The first outer corner 12 of the bezel 710 may be substantially the same as the first outer corner 12 of the bezel 10 of the display device 1 as illustrated in FIG. 1. Compared to the first inner corner 312 of the bezel 10, which forms an angle as illustrated in FIG. 3, the first inner corner 712 of the bezel 10 is rounded. The rounded first inner corner 712 may have a curvature substantially the same as the first curvature of the first outer corner 12 of the bezel 10. However, the exemplary embodiments are not limited thereto, and the rounded first inner corner 712 may have a curvature substantially different from the first curvature of the first outer corner 12 of the bezel 10. For example, the curvature of the rounded first inner corner 712 may have a radius in the range of substantially equal to or greater than 25 mm and substantially equal to or less than 60 mm. More particularly, the radius of the rounded first inner corner 712 may be in the range of substantially equal to or greater than 35 mm and substantially equal to or less than 50 mm.

Figure 8A:
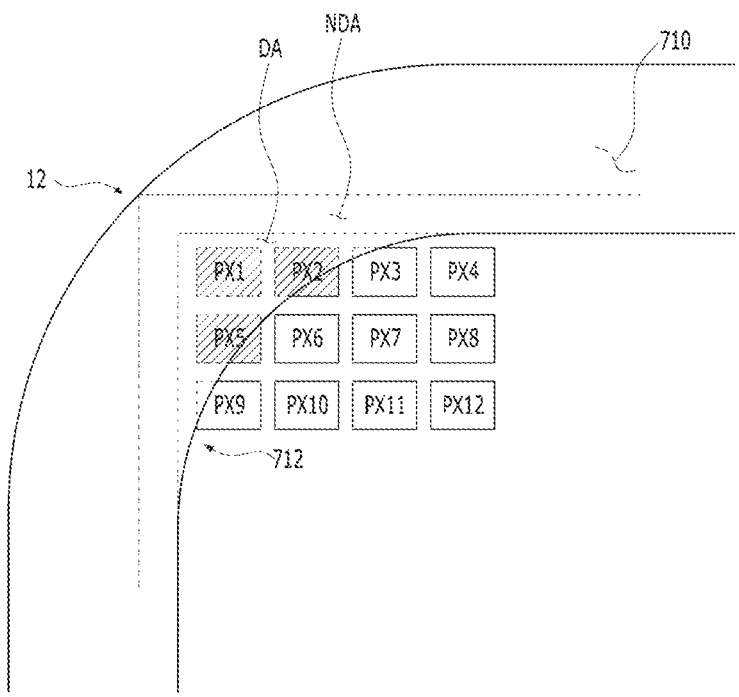
FIGS. 8A and 8B is an enlarged view of the area C of FIG. 7, illustrating exemplary embodiments of the first outer corner and the rounded first inner corner of the bezel of the display device shown in FIG. 7.
Figure 8B:
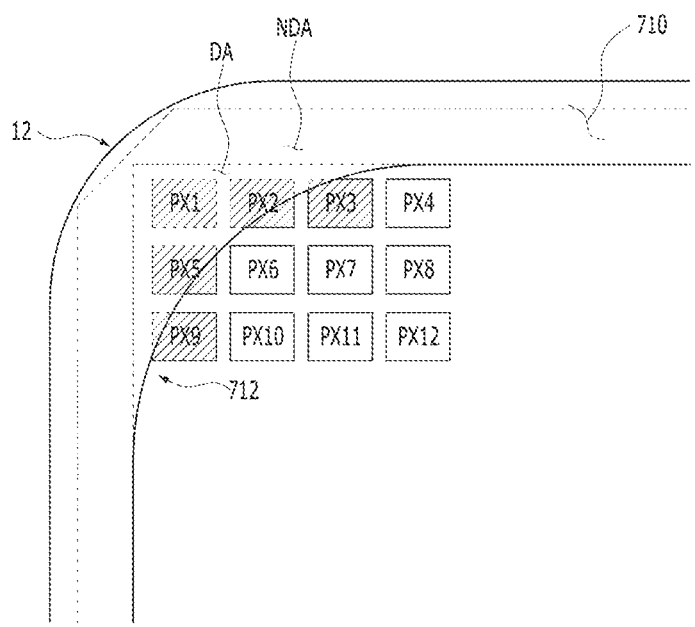

FIGS. 8A and 8B is an enlarged view of the area C of FIG. 7, illustrating exemplary embodiments of the first outer corner 12 and the rounded first inner corner 712 of the bezel 10 of the display device 7 shown in FIG. 7.

Referring to FIG. 8A, the bezel 710 is disposed to cover at least a part of the display unit 20. The bezel 710 of the display device 7 may be disposed covering the non-display area NDA of the display unit 20 and at least a part of the display area DA of the display unit 20. More specifically, the rounded first inner corner 712 may be disposed to cover at least a part of the display area DA adjacent to the first outer corner 12, and at least one pixel disposed adjacent to the first outer corner 12 may be covered by the rounded first inner corner 712 of the bezel 710. The display unit 20 may be disposed inscribed in the bezel 710 to reduce or minimize the width of the bezel 710 of the display device 7.

According to FIG. 8A, the plurality of pixels may include a first pixel PX1, a second pixel PX2, a third pixel PX3, a fourth pixel PX4, a fifth pixel PX5, a sixth pixel PX6, a seventh pixel PX7, an eighth pixel PX8, a ninth pixel PX9, a tenth pixel PX10, an eleventh pixel PX11, and a twelfth pixel PX12 disposed in the display area DA at the vicinity of the rounded first inner corner 712 of the bezel 710. According to FIG. 8A, the first pixel PX1 is completely covered by the rounded first inner corner 712 of the bezel 710, at least a part of the second pixel PX2, the third pixel PX3, the fifth pixel PX5, and the ninth pixel PX9 are respectively covered by the rounded first inner corner 712 of the bezel 710, and the fourth pixel PX4, the sixth pixel PX6, the seventh pixel PX7, the eighth pixel PX8, the tenth pixel, PX10, the eleventh pixel PX11, and the twelfth pixel PX12 are not covered by the rounded first inner corner 712 of the bezel 710.

At least a part of the second pixel PX2, the third pixel PX3, the fifth pixel PX5, and the ninth pixel PX9 are respectively covered by the rounded first inner corner 712 of the bezel 710. More specifically, parts of the second pixel PX2 and the fifth pixel and PX5 covered by the rounded first inner corner 712 of the bezel 710 are equal to or more than 50% of the respective surface area of the second pixel PX2 and the fifth pixel PX5. Parts of the third pixel PX3 and the ninth pixel PX9 covered by the rounded first inner corner 712 of the bezel 710 are less than 50% of the respective surface area of the third pixel PX3 and the ninth pixel PX9.

According to the exemplary embodiment illustrated in FIG. 8A, the pixels completely covered by the rounded first inner corner 712 of the bezel 710 and the pixels with equal to or more than 50% of their respective surface areas covered by the rounded first inner corner 712 of the bezel 710 are operated in the corner mode. Accordingly, the first pixel PX1, the second pixel PX2, and the fifth pixel PX5 are operated in the corner mode.

When a pixel is operated in the corner mode, the pixel is operated to generate a certain color. For example, the pixel operated in the corner mode may be operated to generate a first color which is substantially identical to the color of the bezel 710. According to the exemplary embodiments, at least one of the pixels covered by the rounded first inner corner 712 may be configured to operate in the corner mode and the pixels covered the rounded first inner corner 712 may be configured to generate a first color which is substantially identical to the color of the bezel 710.

FIG. 8B illustrates an exemplary embodiment which is substantially the same as the exemplary embodiment of FIG. 8A, except for the non-display area and the operation of the pixels that is partially covered by the rounded first inner corner 712.

According to FIG. 8B, the corner of the display unit 820 may be trimmed. For example, the non-display area NDA at the corner of the display unit 820 may be trimmed, and the display area DA may be inscribed in the display unit 820. The display unit 820 including the non-display NDA having the corner trimmed, may also be inscribed in the bezel 810.

Accordingly, the display device 7 may include the bezel 710 of the display device 7 having further reduced or minimized width.

Also, According to FIG. 8B, the second pixel PX2, the third pixel PX3, the fifth pixel PX5, and the ninth pixel PX9 are partially covered by the rounded first inner corner 712. The display unit 20 of the display device 7 may operate the pixels completely and partially covered by the rounded first inner corner 712. More specifically, compared to the exemplary embodiment illustrated in FIG. 8A, the second pixel PX2, the third pixel PX3, the fifth pixel PX5, and the ninth pixel PX9 are also operated in the corner mode.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
a display unit configured to display an image in a display area surrounded by a non-display area; and
a frame covering at least a portion of the non-display area, the frame having a rounded outer corner and an inner corner,
wherein the display unit includes:
a display panel having a first set of pixels disposed directly adjacent to the inner corner of the frame and a second set of pixels disposed in the display area; and
a signal controller configured to receive an input image signal, generate an image data signal in response to the received input image signal, and control the first set of pixels to display the image and the second set of pixels to constantly display a first color to create the appearance of rounded corners in the display area,
wherein the first color is substantially similar to the color of the frame,
wherein the appearance of the rounded corners in the display area is represented by a boundary between the first set of pixels and the second set of pixels directly adjacent to the first set of pixels,
wherein the signal controller comprises:
a memory including a preset database of the second set of pixels corresponding with a level of curvature,
wherein the signal controller is configured to create the appearance of rounded corners to have the curvature in response to the preset database
wherein a processor of the signal controller is configured to extract the second set of pixels corresponding to the level of curvature, and
wherein the display device is configured to receive a user signal from a user, the user signal comprising a corner signal indicating a level of curvature.

2. The display device of claim 1, further comprising:
a plurality of ambient lights supported by the frame to generate a light having a color substantially similar to the first color.

3. The display device of claim 1, wherein the display panel comprises a liquid crystal display (LCD) panel or light emitting diode (LED) display panel.

* * * * *